(12) United States Patent
Ning

(10) Patent No.: US 11,854,662 B2
(45) Date of Patent: Dec. 26, 2023

(54) MEMORY

(71) Applicant: CHANGXIN MEMORY TECHNOLOGIES, INC., Anhui (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 128 days.

(21) Appl. No.: 17/517,766

(22) Filed: Nov. 3, 2021

(65) Prior Publication Data

US 2022/0068336 A1    Mar. 3, 2022

Related U.S. Application Data

(63) Continuation of application No. PCT/CN2021/104776, filed on Jul. 6, 2021.

(30) Foreign Application Priority Data

Aug. 26, 2020    (CN) .......................... 202010873279.X

(51) Int. Cl.
  *G11C 7/22*    (2006.01)
  *G11C 8/18*    (2006.01)
  *G11C 7/10*    (2006.01)

(52) U.S. Cl.
  CPC .............. *G11C 7/222* (2013.01); *G11C 7/109* (2013.01); *G11C 7/1063* (2013.01); *G11C 8/18* (2013.01)

(58) Field of Classification Search
  CPC ................................... G11C 7/222; G11C 7/22
  (Continued)

(56) References Cited

U.S. PATENT DOCUMENTS 6,934,201 B2 *   8/2005   Ware ................... G11C 7/1039
                                                     365/194
8,194,090 B2     6/2012   Sato
(Continued)

FOREIGN PATENT DOCUMENTS

CN    101488337 A    7/2009
CN    102402493 A    4/2012
(Continued)

OTHER PUBLICATIONS

International Search Report in the international application No. PCT/CN2021/104776, dated Oct. 13, 2021, 2 pgs.
(Continued)

*Primary Examiner* — Muna A Techane
(74) *Attorney, Agent, or Firm* — Cooper Legal Group, LLC

(57) ABSTRACT

Memory includes at least one memory chip, a command port and a data port. Each memory chip includes at least one channel. Each channel includes multiple banks that are configured to perform read and write operations alternately. The command port is configured to receive command signals at a preset edge of a command clock, and the command signals are configured to control the read and write operations of the banks. The data port is configured to receive data signals to be written into the banks or transmit data signals at preset edges of a data clock. The command port includes a row address port and a column address port. The row address port is configured to receive a row address signal at a position of a target memory cell, and the column address port is configured to receive a column address signal at a position of the target memory cell.

19 Claims, 3 Drawing Sheets

(58) Field of Classification Search
USPC .................................................. 365/233.1
See application file for complete search history.

(56) References Cited

U.S. PATENT DOCUMENTS

| | | |
|---|---|---|
| 8,447,908 B2 | 5/2013 | Bruce |
| 8,635,390 B2 | 1/2014 | Hnatko |
| 8,947,931 B1 | 2/2015 | D'Abreu |
| 9,170,744 B1 | 10/2015 | Smith |
| 9,396,766 B2 | 7/2016 | Lym |
| 9,805,802 B2 | 10/2017 | Son et al. |
| 10,446,198 B2 | 10/2019 | Hasbun et al. |
| 10,725,913 B2 | 7/2020 | Hasbun et al. |
| 10,915,473 B2 | 2/2021 | Jang |
| 10,978,116 B2 | 4/2021 | Hasbun et al. |
| 2002/0060948 A1 | 5/2002 | Chang |
| 2002/0174311 A1 | 11/2002 | Ware |
| 2004/0054845 A1 | 3/2004 | Ware |
| 2004/0105292 A1 | 6/2004 | Matsui |
| 2004/0170072 A1 | 9/2004 | Ware |
| 2005/0169097 A1 | 8/2005 | Ware |
| 2006/0007761 A1 | 1/2006 | Ware |
| 2006/0039174 A1 | 2/2006 | Ware |
| 2006/0069895 A1 | 3/2006 | Ware |
| 2006/0090149 A1 | 4/2006 | Blanco |
| 2006/0129776 A1 | 6/2006 | Ware |
| 2006/0233012 A1 | 10/2006 | Sekiguchi |
| 2007/0064462 A1 | 3/2007 | Matsui |
| 2007/0198868 A1* | 8/2007 | Barth .............. G11C 8/18 713/401 |
| 2007/0255919 A1 | 11/2007 | Ware |
| 2009/0063887 A1 | 3/2009 | Ware |
| 2009/0122587 A1 | 5/2009 | Matsui |
| 2009/0138646 A1 | 5/2009 | Ware |
| 2009/0150710 A1 | 6/2009 | Bilger |
| 2009/0184971 A1 | 7/2009 | Sato |
| 2011/0161568 A1 | 6/2011 | Bruce |
| 2011/0164460 A1 | 7/2011 | Kajigaya |
| 2012/0059958 A1 | 3/2012 | Hnatko |
| 2012/0059977 A1 | 3/2012 | Chuang |
| 2012/0092944 A1 | 4/2012 | Lin |
| 2012/0213020 A1 | 8/2012 | Ware |
| 2012/0287725 A1 | 11/2012 | Ware |
| 2013/0148448 A1 | 6/2013 | Matsui |
| 2013/0227229 A1 | 8/2013 | Ishikawa |
| 2013/0250706 A1 | 9/2013 | Ware et al. |
| 2013/0279278 A1 | 10/2013 | Ware et al. |
| 2013/0305079 A1 | 11/2013 | Ware et al. |
| 2014/0098622 A1 | 4/2014 | Ware et al. |
| 2014/0169111 A1 | 6/2014 | Kajigaya et al. |
| 2014/0293705 A1 | 10/2014 | Gillingham |
| 2015/0043290 A1 | 2/2015 | Ware et al. |
| 2016/0065190 A1 | 3/2016 | Paul |
| 2016/0093378 A1 | 3/2016 | Lym |
| 2016/0196864 A1 | 7/2016 | Ware et al. |
| 2017/0053691 A1 | 2/2017 | Ware et al. |
| 2017/0069364 A1 | 3/2017 | Shin et al. |
| 2017/0076768 A1 | 3/2017 | Son et al. |
| 2017/0194945 A1 | 7/2017 | Paul |
| 2017/0365309 A1 | 12/2017 | Shin et al. |
| 2018/0005689 A1 | 1/2018 | Hsieh |
| 2018/0012644 A1 | 1/2018 | Ware et al. |
| 2018/0033489 A1 | 2/2018 | Son et al. |
| 2018/0218762 A1 | 8/2018 | Matsui |
| 2018/0293190 A1 | 10/2018 | Jang |
| 2019/0065050 A1 | 2/2019 | Shin et al. |
| 2019/0102298 A1 | 4/2019 | Hasbun et al. |
| 2019/0102330 A1 | 4/2019 | Hasbun et al. |
| 2019/0103143 A1 | 4/2019 | Hasbun et al. |
| 2019/0146911 A1 | 5/2019 | Ha et al. |
| 2019/0198084 A1 | 6/2019 | Penney |
| 2019/0205051 A1 | 7/2019 | Choi et al. |
| 2019/0311762 A1 | 10/2019 | Penney |
| 2019/0325936 A1 | 10/2019 | Ware et al. |
| 2019/0348085 A1 | 11/2019 | Matsui |
| 2020/0020367 A1 | 1/2020 | Hasbun et al. |
| 2020/0075069 A1 | 3/2020 | Kim |
| 2020/0125257 A1 | 4/2020 | Shin et al. |
| 2020/0125506 A1 | 4/2020 | Crisp |
| 2020/0176038 A1 | 6/2020 | Kim |
| 2020/0202910 A1 | 6/2020 | Park et al. |
| 2020/0278790 A1 | 9/2020 | Shin et al. |
| 2020/0327057 A1 | 10/2020 | Hasbun et al. |
| 2021/0027825 A1 | 1/2021 | Ware et al. |
| 2021/0272608 A1 | 9/2021 | Matsui |
| 2021/0358529 A1 | 11/2021 | Shin et al. |
| 2022/0351764 A1 | 11/2022 | Shin et al. |

FOREIGN PATENT DOCUMENTS

| | | |
|---|---|---|
| CN | 102456392 A | 5/2012 |
| CN | 102541782 A | 7/2012 |
| CN | 103150272 A | 6/2013 |
| CN | 106463499 A | 2/2017 |
| CN | 106796813 A | 5/2017 |
| CN | 109599138 A | 4/2019 |
| CN | 109599139 A | 4/2019 |
| CN | 109599141 A | 4/2019 |
| CN | 109783009 A | 5/2019 |
| CN | 109994138 A | 7/2019 |
| CN | 110880341 A | 3/2020 |
| CN | 111540391 A | 8/2020 |
| CN | 211207252 U | 8/2020 |

OTHER PUBLICATIONS

International Search Report in the international application No. PCT/CN2021/098752, dated Sep. 8, 2021, 2 pgs.
International Search Report in the international application No. PCT/CN2021/099868, dated Sep. 15, 2021, 2 pgs.
International Search Report in the international application No. PCT/CN2021/103706, dated Sep. 28, 2021, 2 pgs.
International Search Report in the international application No. PCT/CN2021/125785, dated Jan. 25, 2022, 3 pgs.
Supplementary European Search Report in the European application No. 21860596.2, dated Nov. 23, 2022, 8 pgs.
Supplementary Partial European Search Report in the European application No. 21859788.8, dated Dec. 1, 2022, 17 pgs.

* cited by examiner

MEMORY

CROSS-REFERENCE TO RELATED APPLICATIONS

The present application is a continuation of International Patent Application No. PCT/CN2021/104776, filed on Jul. 6, 2021, which claims priority to Chinese Patent Application No. 202010873279.X, filed on Aug. 26, 2020 and entitled "Memory". The disclosures of International Patent Application No. PCT/CN2021/104776 and Chinese Patent Application No. 202010873279.X are hereby incorporated by reference in their entireties.

BACKGROUND

A Dynamic Random Access Memory (DRAM) is a semiconductor memory device commonly used in computers, which consists of many repeated memory cells. Each memory cell generally includes a capacitor and a transistor. A gate of the transistor is connected to a word line, a drain of the transistor is connected to a bit line, and a source of the transistor is connected to the capacitor. A voltage signal on the word line is capable of controlling the on or off of the transistor to read data information stored in the capacitor via the bit line or to write data information to the capacitor for storage via the bit line.

With more and more application fields of DRAM, for example, DRAM is increasingly applied to various fields, the requirements of users on DRAM performance indexes are higher and higher, and the requirements on DRAM are different in different application fields.

SUMMARY

The embodiments of the present disclosure provide a memory which may include at least one memory chip, each of the at least one memory chip including at least one channel, wherein the channel includes: a plurality of banks, each bank including a plurality of memory cells, wherein the plurality of banks are configured to do read and write operations alternately; a command port, configured to receive command signals at a preset edge of a command clock, wherein the command signals are configured to control the read and write operations of the bank; and a data port, configured to receive a data signal to be written into the bank or transmit a data signal at a preset edge of a data clock. The command port includes a row address port and a column address port. The row address port is configured to receive a row address signal of a position of a target memory cell, and the column address port is configured to receive a column address signal of a position of the target memory cell. The target memory cell is selected from the plurality of memory cells.

BRIEF DESCRIPTION OF THE DRAWINGS

One or more embodiments are illustrated by figures in the accompanying drawings to which they correspond. Unless specifically stated otherwise, the figures in the accompanying drawings do not constitute a proportional limitation.

DETAILED DESCRIPTION

It is found through analysis that in order to reduce the number of pins, a current memory uses a same port to receive a row address signal and a column address signal. The port cannot receive the column address signal while receiving the row address signal, and cannot receive the row address signal while receiving the column address signal, so that technical means such as pre-fetch and/or burst usually need to be used in order to realize continuous transmission of data signals and obtain a higher transmission speed. This will increase the granularity (data size) of each read of data. Especially for a memory in a high-bandwidth application scenario, the situation is even worse. In some applications, large increase of granularity may cause waste of data on a bus, and flexibility is poor.

The embodiments of the present disclosure provide a memory with separated row and column address ports to solve the above problems.

In order to make the objectives, technical solutions and advantages of embodiments of the present disclosure clearer, the various embodiments of the present disclosure will be described in detail below with reference to the accompanying drawings. However, it will be appreciated by a person of ordinary in the art that in the various embodiments of the present disclosure, numerous technical details are set forth in order to enable the reader to better understand the present disclosure. However, the technical solutions claimed in the present disclosure can be implemented even without these technical details and various changes and modifications based on the following embodiments.

Figure 1:
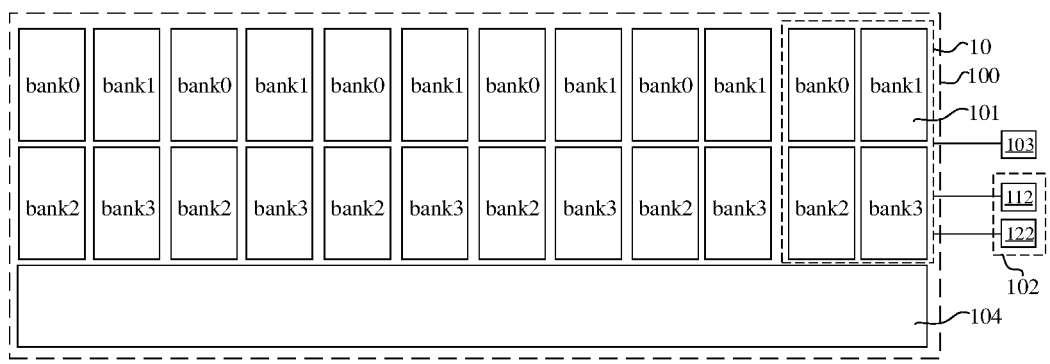
FIG. 1 is a schematic structural diagram of a memory chip in a memory provided by an embodiment of the present disclosure.
Figure 2:
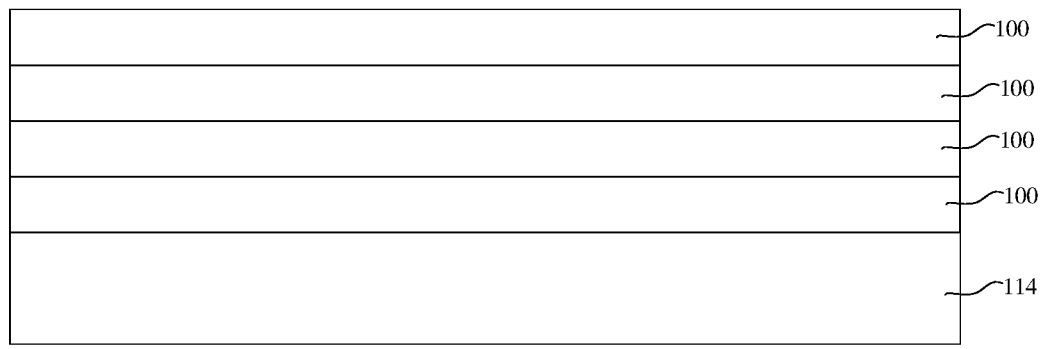
FIG. 2 is a schematic structural diagram of a memory including a plurality of memory chips provided by an embodiment of the present disclosure.
Figure 3:
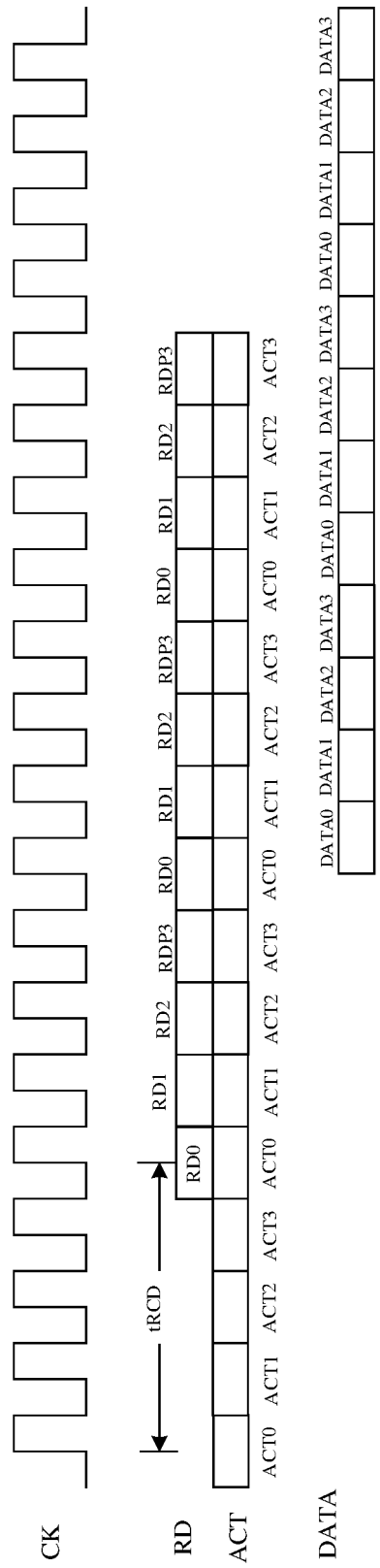
FIG. 3 is a timing diagram of various operating signals corresponding to a memory provided by an embodiment of the present disclosure.
Figure 4:
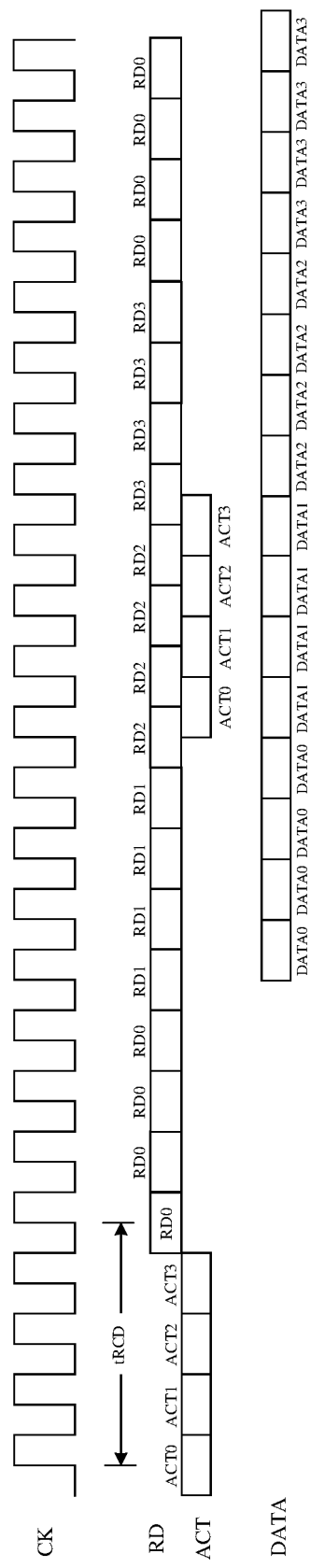
FIG. 4 is another timing diagram of various operating signals corresponding to a memory provided by an embodiment of the present disclosure.

FIG. 1 is a schematic structural diagram of a memory chip in a memory provided by an embodiment of the present disclosure. FIG. 2 is a schematic structural diagram of a memory including a plurality of memory chips provided by an embodiment of the present disclosure. FIG. 3 is a timing diagram of various operating signals corresponding to a memory provided by an embodiment of the present disclosure. FIG. 4 is another timing diagram of various operating signals corresponding to a memory provided by an embodiment of the present disclosure.

Referring to FIGS. 1-3, in this embodiment, the memory includes at least one memory chip 100. Each of the memory chip 100 includes at least one channel 10, where the channel 10 includes: a plurality of banks 101, each including a plurality of memory cells, where the plurality of banks 101 are configured to perform read and write operations alternately; a command port 102, configured to receive command signals at a preset edge of a command clock, where the command signals are configured to control the read and write operations of the plurality of banks 101; a data port 103, configured to receive a data signal to be written into the bank 101 or transmit a data signal at a preset edge of a data clock; a command port 102, including a row address port 112 and a column address port 122. The row address port 112 is configured to receive a row address signal of a position of a target memory cell, and the column address port 122 is configured to receive a column address signal of a position of the target memory cell. The target memory cell is selected from the plurality of memory cells.

It is to be noted that the command port in this embodiment includes, but is not limited to, a port through which command signals are transmitted and a port through which address signals are transmitted.

Hereinafter, the memory provided by this embodiment will be described in detail with reference to the accompanying drawings.

The memory provided by this embodiment may be a dynamic random access memory (DRAM).

The plurality of memory cells in each bank 101 may be distributed in an array. In this embodiment, with each channel 10 including 4 banks 101 as an example, 4 banks 101 in one channel 10 are illustrated in FIG. 1 as bank 0, bank 1, bank 2 and bank 3. It will be appreciated that in other embodiments, the number of banks included in each channel may be any other number, such as 2 or 6.

The data port 103 is configured to receive data to be stored in the memory cell or to transmit data read out from the memory cell.

The memory chip 100 includes a plurality of channels 10, and the memory chip 100 further includes a common circuit 104 shared by the plurality of channels 10. In this embodiment, the common circuit 104 may be a test control circuit, and the test control circuit is configured to control testing of the plurality of channels 10. In other embodiments, the common circuit may also be at least one of a temperature sensor circuit, an analog circuit, or a charge pump circuit.

The memory may further include a test port. The plurality of channels 10 share a same test port for testing in a test mode. The common port is beneficial to reducing the number of ports in the memory, so that the difficulty of testing the memory by adopting a probe card is reduced, and the manufacturing difficulty of the probe card is reduced.

Referring to FIG. 2, the memory may further include: a control chip 114. The control chip 114 is electrically connected to the memory chip 100, and the plurality of memory chips 100 are electrically connected to the control chip 114 through separate signal channels respectively.

Specifically, the plurality of memory chips 100 may be sequentially stacked on the control chip 114, which is beneficial to improving a memory density and reducing a distance between the memory chip 100 and the control chip 114. Alternatively, the plurality of memory chips 100 may also be disposed side-by-side on the control chip 114, which is beneficial to reducing a longitudinal thickness of the memory. In this embodiment, the plurality of memory chips 100 are sequentially stacked on the control chip 114, and the signal channel includes a Through Silicon Via (TSV) structure.

In this embodiment, the command clock and the data clock are a same clock signal. FIG. 3 shows a timing diagram of the clock signal with CK. Therefore, circuit design is favorably simplified, data receiving or transmitting errors caused by errors generated by handshaking or synchronization of the command clock and the data clock are avoided, and the memory accuracy of the memory is improved. It is to be noted that in other embodiments, the command clock and the data clock may also be different clock signals, and correspondingly, clock edges of the command clock and the data clock needs to be distinguished.

In addition, in this embodiment, a plurality of memory chips 100 are provided. Each memory chip 100 uses a same clock signal. The command port and the data port of each memory chip 100 receive or transmit signals by using a same preset edge. The preset edge may be at least one of a clock rising edge or a clock falling edge. In this embodiment, the preset edge that is the clock rising edge is taken as an example.

Specifically, the command signals include activation commands and read commands corresponding to respective activation commands. The channel 10 is further configured such that after the command port 102 receives an activation command for a bank, the command port receives a read command corresponding to the activation command More specifically, the activation command includes a row address signal, and the row address signal is received through the row address port 112. The read command includes a column address signal, and the column address signal is received through the column address port 122. It is to be noted that the activation command and the read command may further include other control signals besides the row address signal or the column address signal, and the other control signals are configured to help or assist the memory chip 100 to identify whether the command is an activation command or a read command. These other control signals may be received through other command ports besides the row address port 112 and the column address port 122. Thus, the row address port 112 can continuously receive the row address signals, and the column address port 122 can continuously receive the column address signals. Correspondingly, the channel 10 is further configured such that the activation command and the read command are received through different ports of the command port 102, so that simultaneous reception of the activation command and the read command can be achieved.

In this embodiment, the command signals include activation commands and read commands corresponding to the respective activation command. The channel 10 is further configured such that after the command port alternately receives the activation commands for different banks 101, the command port alternately receives the read commands corresponding to the activation commands Specifically, after the row address port alternately receives the activation commands for the different banks, the column address port alternately receives the read commands corresponding to the activation commands.

Further, the channel 10 is further configured such that after the command port receives the read command, the data port alternately sends data signals corresponding to different banks.

Hereinafter, an operating principle of the memory will be described with reference to timing diagrams.

FIG. 3 shows a clock signal with CK, ACT shows a timing diagram of activation command signals, RD shows a timing diagram of a read command signal, and DATA shows a timing diagram of a data signal. By taking the four banks 101 of bank0, bank1, bank2 and bank3 as an example, the activation command signals includes ACT0/ACT1/ACT2/ACT3 for activating bank0, bank1, bank2 and bank3, respectively. ACT0 corresponds to bank0, ACT1 corresponds to bank1, and so on. The read command signal includes RD0/RD1/RD2/RD3 in one-to-one correspondence with bank0, bank1, bank2 and bank3, and the data signal includes DATA0/DATA1/DATA2/DATA3. The activation command ACT0 corresponds to bank0, one read command RD0 and the data signal DATA0, the activation command ACT1 corresponds to bank1, one read command RD1 and the data signal DATA1. The activation command ACT2 corresponds to bank2, one read command RD2 and the data signal DATA2. The activation command ACT3 corresponds to bank3, one read command RD3 and the data signal DATA3. That is, one activation command corresponds to one read command.

As illustrated in FIG. 3, after the command port 102 receives the activation command ACT0 for one bank 101 at the rising edge of the clock signal, the command port 102 receives one read command RD0 corresponding to the activation command ACT0 at the rising edge. After the command port 102 receives the read command RD0, the data port 103 sends the data signal DATA0 at the rising edge of the clock signal. The flow after the command port 102 receives the activation commands ACT1/ACT2/ACT3 is similar to that described above. Specifically, the row address port 112 in the command port 102 receives the activation command ACT0 for activating bank0 at a first rising edge of the clock signal, and the row address port 112 in the command port 102 receives the activation command ACT1 for activating bank1 at a second rising edge of the clock signal, receives the activation command ACT2 for activating bank2 at a third rising edge of the clock signal, and receives the activation command ACT3 for activating bank3 at a fourth rising edge of the clock signal. The column address port 122 in the command port 102 receives the read command RD0 corresponding to the activation command ACT0 at an nth rising edge. The command port receives the read command RD1 corresponding to the activation command ACT1 at an (n+1)th rising edge, receives the read command RD2 corresponding to the activation command ACT2 at an (n+2)th rising edge, and receives the read command RD3 corresponding to the activation command ACT3 at an (n+3)th rising edge, where n is an arbitrary natural number. Correspondingly, the data port 103 sends a data signal DATA0 corresponding to the bank bank0 at an mth rising edge of the clock signal. The data port 103 sends a data signal DATA1 corresponding to the bank bank1 at an (m+1)th rising edge of the clock signal, sends a data signal DATA2 corresponding to bank2 at an (m+2)th rising edge, and sends a data signal DATA3 corresponding to bank3 at an (m+3)th rising edge, where m is an arbitrary natural number, and for each bank 101, the corresponding m is greater than n.

It is to be noted that in FIG. 3, as an example, the activation commands ACT0, ACT1, ACT2, ACT3 are received at the continuous rising edges, respectively, i.e. the activation commands corresponding to different banks 101 are received at the continuous rising edges, respectively. In other embodiments, the activation commands corresponding to different banks may also be received at non-continuous rising edges, respectively.

As can be seen from FIG. 3, since the row address port 112 and the column address port 122 are not shared, the row address port 112 can receive the activation command ACT2 while the column address port 122 receives the read command RD2, and thus, the activation command can be received without waiting for all the read command signals to be received, so that the data bus can be filled up. That is, the data port 103 can continuously transmit data, and idle of the data bus in a certain time period is avoided, which is beneficial to improving the memory speed of the memory.

In another example, the command signals include activation commands and a plurality of read commands corresponding to each activation command. The channel 10 is further configured such that after the command port 102 receives an activation command for one bank 101, the command port 102 receives a read command corresponding to the activation command at each of a plurality of preset edges, so that the command port 102 receives a plurality of read commands corresponding to the activation command at the plurality of preset edges. In this embodiment, the channel 10 is further configured such that the data port 103 sends a data signal after the command port 102 receives the read command. The channel 10 may further be configured such that the data port 103 sends a plurality of data signals at a plurality of consecutive preset edges, respectively, and the number of data signals is the same as the number of the read commands received.

Besides, each activation command corresponds to a plurality of read commands. The channel 10 may further be configured such that the command port 102 alternately receives activation commands for different banks 101, and the command port 102 alternately receives a plurality of read commands corresponding to each activation command Specifically, after the command port 102 alternately receives the activation commands for the different storage blocks 101, the command port 102 receives one read command corresponding to the activation command at each of a plurality of preset edges, so that the command port 102 receives a plurality of read commands corresponding to the activation command at a plurality of consecutive preset edges until the command port 102 receives a plurality of read commands corresponding to the activation command for one bank 101. Then, the command port 102 receives a plurality of read commands corresponding to the activation command for another bank 101.

The operating principle of the memory is described below with reference to FIG. 4.

FIG. 4 shows a clock signal with CK, ACT shows a timing diagram of an activation command signals, RD shows a timing diagram of a read command signal, and DATA shows a timing diagram of a data signal. The activation command signals include ACT0/ACT1/ACT2/ACT3 in one-to-one correspondence with bank0, bank1, bank2 and bank3, respectively. The read command signals include RD0/RD1/RD2/RD3, and the data signal includes DATA0/DATA1/DATA2/DATA3. The activation command ACT0 for activating bank0 corresponds to 4 read commands RD0 and 4 data signals DATA0. The activation command ACT1 for activating bank1 corresponds to 4 read commands RD1 and data signals DATA1, and so on, that is, one activation command corresponds to a plurality of different read commands.

As illustrated in FIG. 4, after the command port 102 receives an activation command ACT0 for one bank 101 at the rising edge of the clock signal, the command port 102 receives 4 read commands RD0 corresponding to the activation command ACT0 at 4 continuous rising edges. After the command port 102 receives the read command RD0, the data port 103 sends four data signals DATA0 at the rising edge of the clock signal. After receiving an activation command ACT1 for another bank 101, the command port 102 receives 4 read commands RD1 corresponding to the activation command ACT1 at 4 continuous rising edges. After the command port 102 receives the read commands RD1, the data port 103 sends four data signals DATA1 at the rising edge of the clock signals. The flow after the command port 102 receives the activation commands ACT2 and ACTS is similar to that described above.

It is to be noted that in this embodiment, the channel 10 is further configured such that for any bank 101, a time difference between receiving the activation command signal and receiving the corresponding read command signal is greater than or equal to tRCD, and tRCD is minimum time required by the bank 101 to prepare for read operation after receiving the activation command signal. Specifically, the definition of tRCD is that an interval from row active to read/write command issue is defined as tRCD, i.e., a delay from RAS to CAS, RAS is a row address strobe pulse signal, a row address signal for short, CAS is a column address strobe pulse signal, a column address signal for short, and tRCD may be interpreted as a row strobe period. Thus, it can be guaranteed that the bank 101 is fully activated before or when the read command is received, and a read operation can be performed when the read command is received, so that the memory speed of the memory is further improved.

Specifically, as illustrated in FIGS. 3 and 4, for bank0, a time difference between ACT0 and RD0 is tRCD; and for bank1, a time difference between ACT1 and RD1 may be greater than or equal to tRCD. The cases with respect to bank2 and bank3 are omitted here. Regardless of whether one activation command corresponds to one read command or a plurality of read commands, it can be guaranteed through reasonable settings that for any bank 101, the time difference between receiving the command signal and receiving the corresponding read command signal is greater than or equal to tRCD.

In the memory provided in this embodiment, different banks 101 use the same command port 102 and data port 103. In other embodiments, different banks may also use different command ports and different data ports.

According to the memory provided by this embodiment, the row address port 112 is separated from the column address port 122, so that the row address signals and the column address signals can be simultaneously transmitted, and data receiving or transmitting errors caused by errors generated by handshaking or synchronization of the command clock and the data clock are avoided. Thus, the problem that the data line is not fully occupied in certain time periods is favorably avoided, it is ensured that the data line is always fully occupied by data, accordingly, the memory speed of the memory is increased, and the memory performance of the memory is improved.

It will be understood by an ordinary person skilled in the art that the embodiments described above are specific examples for implementation of the present disclosure, and various changes in form and details may be made in practical application without departing from the spirit and scope of the present disclosure. Any person skilled in the art can make various changes and modifications without departing from the spirit and scope of the present disclosure, and therefore the protection scope of the present disclosure should be determined by the scope of the claims.

The invention claimed is:

1. A memory, comprising:
at least one memory chip, each of the at least one memory chip comprising at least one channel, wherein each of the at least one channel comprises:
a plurality of banks, each of the plurality of banks comprising a plurality of memory cells, wherein the plurality of banks are configured to perform read and write operations alternately;
a command port for each of the at least one memory chip, configured to receive command signals at a preset edge of a command clock, wherein the command signals are configured to control the read and write operations of the plurality of banks; and
a data port for each of the at least one memory chip, configured to receive data signals to be written into the plurality of banks or transmit data signals at a preset edge of a data clock;
wherein the command port comprises a row address port and a column address port, the row address port is configured to receive a row address signal of a position for a target memory cell, the column address port is configured to receive a column address signal of a position for the target memory cell, and the target memory cell is selected from the plurality of memory cells.

2. The memory of claim 1, wherein the command clock and the data clock are a same clock signal.

3. The memory of claim 1, wherein a plurality of memory chips are provided, the plurality of memory chips use a same clock signal, and the command ports and the data ports of respective memory chips of the plurality of memory chips receive or transmit a signal by using a same preset edge.

4. The memory of claim 3, wherein the same preset edge is a clock rising edge or a clock falling edge.

5. The memory of claim 1, wherein the command signals comprise activation commands and read commands each of which corresponds to a respective activation command; and each of the at least one channel is further configured such that after the command port receives an activation command for one of the plurality of banks, the command port receives a read command corresponding to the activation command.

6. The memory of claim 5, wherein each of the at least one channel is further configured such that the data port sends the data signal after the command port receives the read command.

7. The memory of claim 1, wherein the command signals comprise activation commands and a plurality of read commands corresponding to each activation command; and each of the at least one channel is further configured such that the command port receives a read command corresponding to the activation command for one of the plurality of banks at each of a plurality of preset edges after the command port receives the activation command, so that the command port receives the plurality of read commands corresponding to the activation command at a plurality of consecutive preset edges.

8. The memory of claim 7, wherein each of the at least one channel is further configured such that the data port sends a plurality of the data signals at the plurality of consecutive preset edges, respectively, and a number of the data signals is the same as a number of the read commands received.

9. The memory of claim 1, wherein the command signals comprise activation commands and read commands corresponding to the respective activation commands; and the channel is further configured such that the command port alternately receives the read commands corresponding to the respective activation commands after alternately receiving the activation commands for different banks.

10. The memory of claim 9, wherein the channel is further configured such that the data port alternately sends the data signals corresponding to different banks after the command port receives the read commands.

11. The memory of claim 1, wherein the command signals comprise activation commands and a plurality of read commands corresponding to each activation command; and each of the at least one channel is further configured such that the command port alternately receives the activation commands for different banks of the plurality of banks, and the command port alternately receives the plurality of read commands corresponding to each activation command.

12. The memory of claim 5, wherein the activation command comprises the row address signal, and the read command comprises the column address signal; and each of the at least one channel is further configured such that the activation command and the read command are received by different ports in the command port.

13. The memory of claim 12, wherein each of the at least one channel is further configured such that for any bank of the plurality of banks, a time difference between receiving the activation command and receiving the read command corresponding to the activation command is greater than or equal to tRCD, and the tRCD is a minimum time required by the bank to prepare for performing a read operation after receiving the activation command.

14. The memory of claim 3, further comprising a control chip, wherein the control chip is electrically connected with the plurality of memory chips, and the plurality of memory chips are electrically connected with the control chip through separate signal channels respectively.

15. The memory of claim 14, wherein the plurality of memory chips are sequentially stacked on the control chip, and each of the signal channels comprises a through silicon via structure.

16. The memory of claim 1, wherein the at least one memory chip comprises a plurality of channels, and further comprises a common circuit shared by the plurality of channels.

17. The memory of claim 16, wherein the at least one memory chip further comprises a test port, and the plurality of channels share a same test port for testing in a test mode.

18. The memory of claim 17, wherein the common circuit comprises a test control circuit, and the test control circuit is configured to control testing of the plurality of channels.

19. The memory of claim 1, wherein the command port comprises ports for transmitting the command signals and address signals.

\* \* \* \* \*